United States Patent
Delshadpour et al.

(10) Patent No.: US 10,594,285 B1
(45) Date of Patent: Mar. 17, 2020

(54) SIGNAL DETECTOR

(71) Applicant: NXP B.V., Eindhoven (NL)

(72) Inventors: Siamak Delshadpour, Phoenix, AZ (US); Soon-Gil Jung, Cupertino, CA (US); Xiaoqun Liu, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/398,556

(22) Filed: Apr. 30, 2019

(51) Int. Cl.
*H03G 3/34* (2006.01)
*G06F 11/30* (2006.01)
*H03K 5/24* (2006.01)
*H04L 25/02* (2006.01)

(52) U.S. Cl.
CPC ........... *H03G 3/34* (2013.01); *G06F 11/3051* (2013.01); *H03K 5/24* (2013.01); *H04L 25/0272* (2013.01); *H03F 2203/45674* (2013.01)

(58) Field of Classification Search
CPC ...... G06F 11/3051; G06F 1/32; G06F 1/3234; G06F 1/3278; G06F 1/3253; H04L 25/0272; H04L 25/0276; H04L 25/062; H03F 2203/45644; H03F 2203/45674; H03F 2203/45676; H03F 3/3022; H03F 3/45183; H03K 5/22; H03K 5/2481; H03K 5/24
See application file for complete search history.

(56) References Cited

U.S. PATENT DOCUMENTS

| 7,471,118 | B2 | 12/2008 | Liu | |
| 7,653,367 | B2 | 1/2010 | Song et al. | |
| 8,791,691 | B2 | 7/2014 | Cheng | |
| 2003/0099307 | A1* | 5/2003 | Wu | H03F 3/45475 375/317 |
| 2013/0156088 | A1* | 6/2013 | Jin | H04L 25/03834 375/236 |
| 2015/0067209 | A1 | 3/2015 | Liu et al. | |

* cited by examiner

*Primary Examiner* — Kile O Blair (57) ABSTRACT

A signal detector includes an input to receive a differential signal, a generator to generate a first voltage based on the differential signal and a second voltage based on the first voltage and a predetermined voltage, and an output stage to output a detection signal based on the first voltage and the second voltage. The differential signal includes a first signal and a second signal. The detection signal has a first value when a difference between the first and second signals is in a first range and a second value when the difference between the first and second signals is in a second range. The detection signal may indicate the presence or absence of low frequency periodic signaling for the differential signal. Such a detector may demonstrate fast response and operate at low-current.

20 Claims, 4 Drawing Sheets

SIGNAL DETECTOR

TECHNICAL FIELD

Example embodiments disclosed herein relate to detecting signals in electronic circuits.

BACKGROUND

Signal detectors are used in a variety of applications. For example, loss of signal (LoS) and low frequency periodic signaling (LFPS) detectors may be used in communications applications, including those involving the transmission of signals through standards such as a Universal Serial Bus (USB) cable, a display port (DP) interface, a Thunderbolt (TBT) cable, or a converged-IO (CIO), all passing through one connector (e.g., Type-C connector) or different connectors. When used in these applications, LoS and LFPS detectors may detect low-speed or high-speed signals.

In some applications, LFPS and LoS detection is performed in low power modes of a chip used with an interface. Such a chip may, for example, support the high-speed channels of an interface. In this case, LFPS and LoS detection may be performed when the high-speed channels are off or otherwise inactive.

Because high-speed channels consume substantial power, it may be beneficial for the LFPS detector to operate at low power in order to have an offsetting effect. It may also be beneficial to operate at low power (e.g., in one or more low power modes) when a channel is off. It may also be beneficial for an LFPS detector to operate with a fast response, e.g., when used to support a CIO standard having a 3-pulse power-up requirement of the whole high-speed channel including the detector. Also, in some applications, an LFPS detector is directly connected to high-speed pins. In such a case, it may be beneficial for the detector to be implemented in a manner that does not load the high-speed pins. It also may be beneficial for the LFPS detector to perform secondary electrostatic discharge (ESD) protection. LFPS and LoS detectors that currently exist are unable to satisfy these performance standards.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

In accordance with one or more embodiments, a signal detector includes a rectifier configured to generate a first current based on an input signal, a first circuit configured to generate a second current based on a first reference signal, a second circuit configured to generate a third current based on a common mode voltage of the input signal, a reference signal generator configured to generate a fourth current based on a second reference signal and a third reference signal, and a comparator configured to generate a detection signal based on the first current, the second current, the third current, and the fourth current.

The comparator may compare a first voltage and a second voltage, where the first voltage may be based on a sum of the first current and the second current and the second voltage may be based on a sum of the third current and a fourth current. The first voltage may be based on a voltage of a first node that receives the first current and the second current, the second voltage may be based on a voltage of a second node and a voltage of a third node, the second node voltage may be based on the first voltage, and the third node voltage may be based on the second voltage. A filter may be coupled between the second node and the third node.

The signal detector may include a self-bias circuit configured to input a tail current into one or more of the rectifier, the first circuit, the second circuit, and the reference signal generator. An electrostatic discharge protection circuit may be coupled between the input line and the rectifier. A circuit may be included which generates the common mode voltage based on first and second signals, where the input signal may be a differential signal that includes the first and second signals and the circuit may generate the common mode voltage performs electrostatic discharge protection.

The input signal may include a first differential signal and a second differential signal and the rectifier may generate the first current based on the first differential signal and the second differential signal. The first reference signal may correspond to a common mode reference voltage, the second reference signal may correspond to a first reference voltage, the third reference signal may correspond to a second reference voltage, and the common mode reference voltage may be between the first reference voltage and the second reference voltage. The detection signal may indicate presence of low frequency periodic signaling on a channel of an interface.

In accordance with one or more embodiments, a signal detector includes an input to receive a differential signal, a generator to generate a first voltage based on the differential signal and a second voltage based on the first voltage and a predetermined voltage, and an output stage to output a detection signal based on the first voltage and the second voltage, wherein the differential signal includes a first signal and a second signal and wherein the detection signal has a first value when a difference between the first and second signals is in a first range and a second value when the difference between the first and second signals is in a second range.

The first range may be a voltage less than the predetermined voltage and the second range may be a voltage greater than the predetermined voltage. The first value of the detection signal may indicate that the differential signal does not correspond to a predetermined type of signaling, and the second value of the detection signal may indicate that the differential signal corresponds to the predetermined type of signaling. The predetermined type of signaling may be low frequency periodic signaling or another type of signal or signaling.

The generator may generate the first voltage based on a first current and a second current, the first current to be generated based on the first and second signals of the differential signal, and the second current to be generated based on a common mode reference voltage. The predetermined voltage may correspond to a difference between a first reference voltage and a second reference voltage, and the common mode reference voltage may be between the first and second reference voltages. The generator may generate the second voltage based on a third current and a fourth current, the third current to be generated based on a first and second reference voltages, and the fourth current to be generated based on a common mode voltage of the differential signal. The predetermined voltage may be based on a difference between the first and second reference voltages. The signal detector may include a self-bias circuit coupled to the generator and may also include an electrostatic discharge circuit coupled to the input.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In communications application involving standards (e.g., a USB, DP, TBT, CIO) with cables or connectors, LFPS pulses may be detected to enable a high-speed channel for transmitting traffic. In some cases, LFPS signaling may be in the 20-50 MHz range, which by current standards may be relatively low speed. When signals are transmitted based on the CIO standard, LFPS detection should be performed at a fast rate in order to support channel power-up based on less than three pulses (e.g., 3*20 nS=60 nS in worst case). Also, before enabling the channel, the current consumption of the chip (that controls transmission of signals through the interface) should be low.

Example embodiments describe an LFPS detector that operates based on low power in order to support the low-current operation of a chip in order to allow the channel(s) of an interface (e.g., high-speed channel(s)) to be enabled. The LFPS detector may also operate with fast-response time and fast start-up time in order to support a variety of interface standards. In one embodiment, the LFPS detector may consume, for example, a current of ~50 uA to 100 uA, may detect LFPS signaling in a duration of less than one pulse, e.g., 20 nS. In these or other embodiments, the LFPS detector may be self-biased and demonstrate improved accuracy, through the use of an integrated rectifier, low current opamp with hysteresis. In these or other embodiments, the LFPS detector may also perform ESD protection without adversely affecting its performance.

Figure 1:
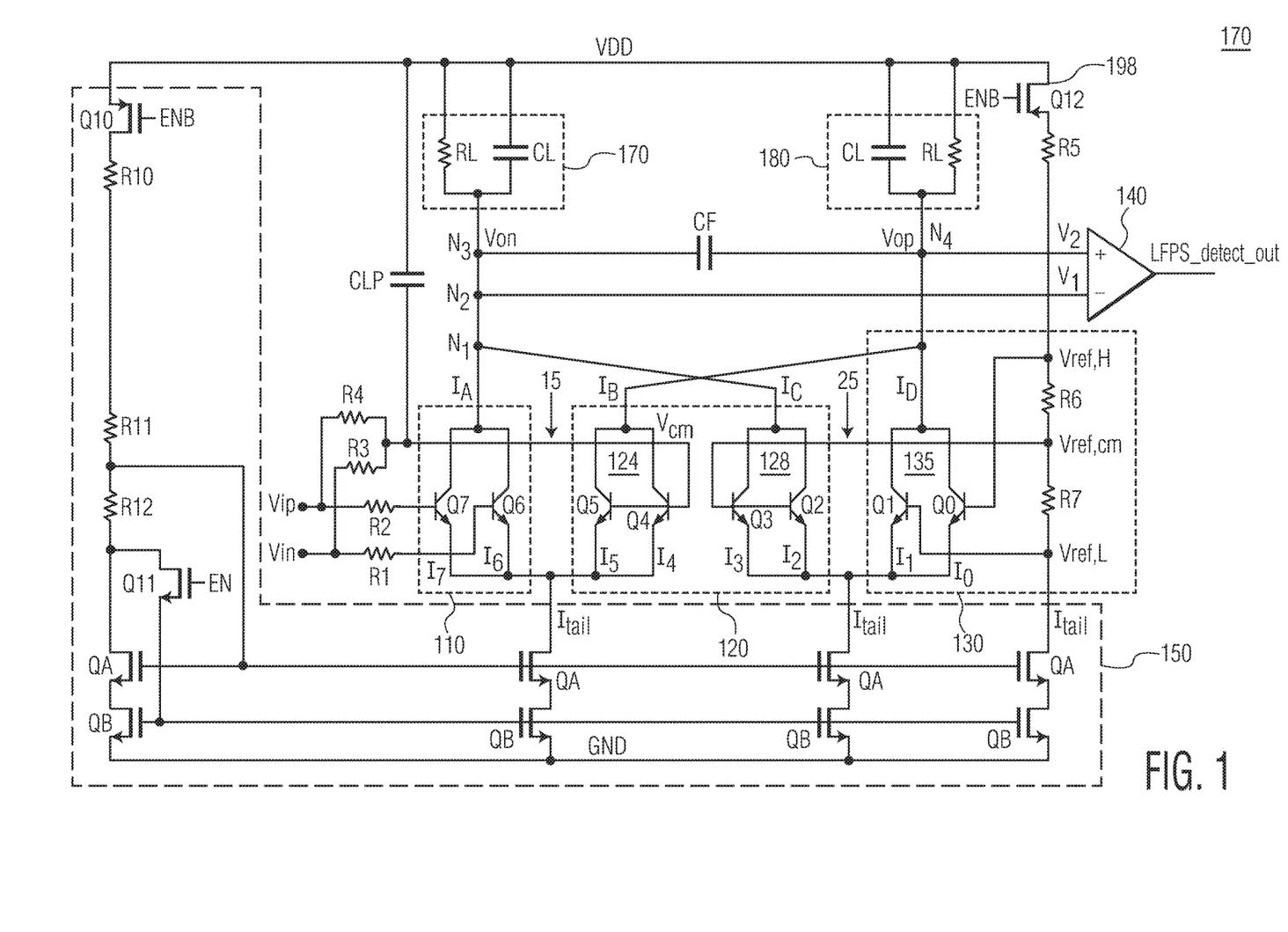
FIG. 1 illustrates an embodiment of a signal detector.

FIG. 1 illustrates an embodiment of a signal detector 100 which includes a rectifier 110, a common mode signal generator 120, a reference level generator 130, and an operational amplifier which may operate as a comparator 140. The signal detector 100 also includes a self-bias circuit 150 to provide bias current to the rectifier, common mode generator, and reference level generator. Such a signal detector may be used as an LFPS signaling detector for one or more (e.g., high-speed) channels of an interface, which, for example, may be a USB Type-C cable or an interface based on a DP, TBT, or CIO standard. For the sake of convenience, the interface will be referred to as a USB cable.

The rectifier 110 is coupled to receive a differential input signal Vip and Vin, which, for example, may correspond to the differential signal lines of a high-speed channel of a USB cable, e.g., USB Type-C. In one embodiment, the rectifier 110 include two bipolar junction transistors $Q_6$ and $Q_7$ connected in parallel between the self-bias circuit 150 and a node N1. When the bases of transistors $Q_6$ and $Q_7$ receive respective signals Vin and Vip of the differential input, currents $I_6$ and $I_7$ from the self-bias circuit flow through the transistors and are added at node N1 to form current $I_A$. Thus, what the rectifier 110 effectively does is transform a differential input signal (Vip, Vin) varying within a predetermined frequency range into a constant-level output voltage determined based on the summed current $I_A$ and the load resistor $R_L$. In one embodiment, transistors $Q_6$ and $Q_7$ may operate in the linear region at this time.

The signals Vin and Vip may be processed in one or more ways before being input into the rectifier 110. For example, the voltages corresponding to signals Vin and Vip may be averaged by a circuit formed by resistors R3 and R4 to generate the common mode voltage $V_{CM}$ of the differential input signal.

A clamp capacitor CLP may be coupled to the node of the circuit formed by resistors R3 and R4. The clamp capacitor may be charged by the voltage VDD on a supply rail. The voltage stored in the clamp capacitor may be added to the common mode voltage $V_{CM}$ to ensure that the base-emitter voltages of transistors $Q_4$ and $Q_5$ are in an appropriate range to cause these transistors to conduct. Because the output voltage of the clamp capacitor CLP is constant and because transistors $Q_4$ and $Q_5$ operate in the linear region at this time, the common mode voltage $V_{CM}$ controls the amount of current $I_4$ and $I_5$ passing through transistors $Q_4$ and $Q_5$, which, in turn, controls the value of current $I_B$, which plays a role in the output of the detector as described in greater detail below.

The resistors R3 and R4 may have resistance values sufficient to provide electrostatic discharge (ESD) protection (e.g., secondary ESD) for the detector. For example, when the differential input signal (Vip,Vin) becomes excessively large as the result of an applied electrostatic charge, the resistors R3 and R4 may dissipate a significant portion of this charge to prevent an excessive voltage from being input into the bases of transistors $Q_4$ and $Q_5$. Without resistors R3 and R4, these transistors may be damaged. In one case, the common mode voltage line 15 of transistors $Q_4$ and $Q_5$ may be sufficiently close to the common mode voltage line 25 of transistors $Q_2$ and $Q_3$ that these transistors may also be damaged by the electrostatic charge as a result of parasitic coupling. Thus, resistors R3 and R4 may service to provide extra ESD protection for all four transistors $Q_2$, $Q_3$, $Q_4$, and $Q_5$. In one embodiment, the sizes of $Q_2$ and $Q_3$ may not be large enough to support self-robustness.

The differential input signal (Vip,Vin) may be coupled to the rectifier 110 through a respective number of resistors R1 and R2. Resistors R1 and R2 may perform secondary ESD protection for transistors $Q_6$ and $Q_7$. These resistors also effectively form a soft low-pass filter that may help the input signal and its common mode component (generated by R3 and R4) to track each other better. In one embodiment, the resistors R1 and R2 may have the same resistance values and/or resistors R3 and R4 may have the same resistance values.

The node N1 at the output of the rectifier is coupled to a parallel RC circuit 170 formed from resistor $R_L$ and capacitor $C_L$. This circuit operates as a filter to suppress any ripple voltage that may be present in the output of the rectifier 110, which ripple voltage may adversely affect voltage Von and thus the output of the comparator 140 which is responsible for indicating the detection result. Additionally, the current $I_A$ through the resistor $R_L$ is partially used to set the voltage levels at nodes N2 and N3, which, in turn, are used to determine the output of the detector, e.g., detect low frequency periodic signaling on the channel associated with the differential input line.

As illustrated in FIG. 1, the voltage formed at node N1 sets the voltage input into the inverting terminal (−) of the operational amplifier forming comparator 140. The voltage at node N1 also helps to form the voltage input into the non-inverting terminal (+). The voltage at node N1 is based on the sum of the current $I_A$ output from the rectifier 110 and a current $I_C$ output from circuit 128 of the common mode signal generator 120. The sum of these currents generates the voltage Von, at nodes N2 and N3, based on the value of resistor $R_L$.

Circuit 128 of the common mode signal generator includes transistors $Q_2$ and $Q_3$ coupled in parallel between node N1 and the self-bias circuit 150. The transistors $Q_2$ and $Q_3$ control the value of the current $I_c$ based on a sum of the currents $I_2$ and $I_3$ passing through transistors $Q_2$ and $Q_3$. The values of the currents $I_2$ and $I_3$ passing through transistors $Q_2$ and $Q_3$ are based on a common mode reference voltage $V_{REF,CM}$. The common mode reference voltage $V_{REF,CM}$ may be predetermined and set based on the current from the self-bias circuit 150 and the values of resistors R5, R6, and R7. Using these resistance values, the voltages $V_{REF,H}$ and $V_{REF,L}$ may be set, which, in turn, sets the common mode reference voltage $V_{REF,CM}$ used to determine the amount of current $I_C$. The value of $I_C$ may be considered a reference current, which may have a constant value for fixed values of R5, R6, and R7. The reference current $I_C$ is added to the current $I_A$ output from the rectifier 110 (which is proportional to the difference between Vip and Vin of the differential input signal) in order to set the node voltage Von at nodes N2 and N3. (Transistors as described herein may operate in the linear region when, for example, $(V_{REF,H}-V_{REF,L})/2$ is much less than $V_{be}$~0.7V.)

In one embodiment, the values of R6 and R7 may be set so that the common mode reference voltage $V_{REF,CM}$ corresponds to an average of $V_{REF,H}$ and $V_{REF,L}$. This average may be predetermined, for example, based on the intended application of the signal detector. For example, the common mode reference voltage $V_{REF,CM}$ may be set to corresponding to one or more operating parameters of a USB Type-C cable, for purposes of detecting an LFPC signal on a high-speed channel. The detection of an LFPS signal may, for example, be input into a controller for powering up or activating the high-speed channel.

Circuit 124 of the common mode generator includes transistors $Q_4$ and $Q_5$ coupled in parallel between node N4 and the self-bias circuit 150. The transistors $Q_4$ and $Q_5$ control the value of the current $I_B$ based on a sum of the currents $I_4$ and $I_5$ passing through transistors $Q_4$ and $Q_5$. The values of the currents $I_4$ and $I_5$ are based on the common mode voltage $V_{CM}$ input into the bases of $Q_4$ and $Q_5$. Because the common mode voltage $V_{CM}$ is generated based on a difference between the differential signals of the input signal, current $I_B$ (which corresponds to the sum of $I_4$ and $I_5$) is proportional to the common mode voltage, which makes current $I_B$ a useful component in detecting LFPS signaling.

Circuit 135 of the reference level generator 130 generates a current $I_D$, which is added to current $I_B$ for performing LFPS signaling detection. Circuit 135 includes transistors $Q_0$ and $Q_1$ connected in parallel and coupled between node N4 and the self-bias circuit 150. Transistors $Q_0$ and $Q_1$ pass currents $I_0$ and $I_1$ when voltages $V_{REF,H}$ and $V_{REF,L}$ are respectively coupled to their bases. As previously explained, the values of resistors R5, R6, and R7 may be selected to control the values of these currents. Thus, in one embodiment, current $I_D$ may have a fixed value that serves as a reference current that is added to current $I_C$ to form voltage Vop at node N4.

The node N4 is coupled to a parallel RC circuit 180 formed from resistor $R_L$ and capacitor $C_L$. Parallel RC circuit 180 is coupled between the rail of supply voltage VDD and node N4 and may be the same or different from the parallel RC circuit 170 previously discussed. Circuit 180 operates as a filter to suppress any ripple voltage that may be present in the signal received at node N4.

The supply voltage VDD may be provided to enable operation of the common mode reference generator 130 and the reference level generator 140 based on enable signal EN. This enable signal EN is coupled to the gate of a PMOS transistor 198 and, for example, may be generated when the state of the channel corresponding to the input signal is in an unpowered or inactive state. In this case, the detector may be enabled to detect LFPS signaling for purpose re-powering or re-activating the channel when, for example, a USB cable is coupled to a host or connected device. A controller of the host or connected device may generate the enable signal.

In one embodiment, the same enable signal EN may be used to power the self-bias circuit 150. The enable signal EN may be coupled to the gates of a PMOS transistor 190 and an NMOS transistor 195. When the enable signal EN has a first value, the detector may be disabled. When the enable signal EN has a second value, the detector may be enabled. The first and second values may be based, for example, on the type of transistors used, e.g., NMOS or PMOS.

The comparator 140 generates a detection signal relative to the differential input line (Vip,Vin) based on the voltage Von at node N2 and the voltage at node N4. The detection signal may have a first value to indicate the presence of a certain type of signaling or signal on the input and may have a second value to indicate the absence of the certain type of signaling or signal. The certain type of signaling may be, for example, LFPS signaling or another type of signal or signaling or condition in a host circuit and/or one or more of its communication channels.

In operation, any difference |Vip−Vin| between the components of the differential signal input into rectifier 110 translates into differences in the voltages applied to the bases of transistors $Q_6$ and $Q_7$, and this is so whether the difference is positive or negative, e.g., whether Vip>Vin or Vin>Vip. When a difference |Vip−Vin|≠0 exists, that difference will cause more current to flow into transistors $Q_6$ and $Q_T$. When |Vip−Vin| increases, current $I_A=I_6+I_7$ increases.

When the signal detector is enabled (EN) and LFPS signaling exists on the differential input line of the channel, the rectifier 110 rectifies the differential input signal. When |Vip−Vin| is less than the difference between the reference voltages $V_{REF,H}$ and $V_{REF,L}$ (that is, when |Vip−Vin|< ($V_{REF,H}$−$V_{REF,L}$)), then Vop at node N4 is greater than Von at node N3, e.g., Vop>Von. When Vop>Von, then the voltage applied to the non-inverting terminal of comparator 140 is negative and thus less than the voltage Von applied to the inverting terminal of the comparator 140 from node N2. As a result, the signal LFPS_detect_out generated at the output of the comparator has a value indicative of the detection of LFPS signaling on the input line of the channel.

In at least one embodiment, a filter may be coupled between node N3 and node N4 in order to suppress noise. The filter may include a capacitor CF operating as a low-pass filter to remove high-frequency components or other spurious signals that might be coupled to the differential input signal or which might otherwise be present, for example, as the result of electromagnetic interference, parasitic coupling from the signal lines of an adjacent channel, and/or other effects.

When the signal detector is enabled (EN) and the |Vip−Vin|∼($V_{REF,H}$−$V_{REF,L}$), which, for example, corresponds to the case where the difference between Vip and Vin, is equal or close to the trip point of the detector, then $I_7$∼$I_0$, $I_6$∼$I_1$, and $I_5$∼$I_4$∼$I_3$∼$I_2$. As a result, Von∼Vop. When the signal detector is enabled and |Vip−Vin| is not equal (or approximately equal) to ($V_{REF,H}$−$V_{REF,L}$), then the output of the signal detector is either a logical 1 or a logical 0.

When the signal detector is enabled (EN) and the input into rectifier 110 includes LFPS signaling that is larger than the threshold reference value, then |Vip−Vin|>($V_{REF,H}$−$V_{REF,L}$). As a result, the following currents are produced in the signal detector (where $I_{tail}$ corresponds to the current output from the self-bias circuit and ac corresponds to a predetermined constant value less than 1:

$$I_7+I_6 \sim I_{tail} \quad (1)$$

$$I_5 \sim I_4 \sim 0 \quad (2)$$

$$I_3+I_2 \sim 2*\alpha*I_{tail}/2 \quad (3)$$

$$I_1+I_0 \sim 2*(1-\alpha)*I_{tail}/2 \quad (4)$$

Based on these currents, the following currents are produced:

$$I_A=I_7+I_6 \sim I_{tail} \quad (5)$$

$$I_B=I_5+I_4 \sim 0 \quad (6)$$

$$I_C=I_3+I_2 \sim \alpha*I_{tail} \quad (7)$$

$$I_D=I_1+I_0 \sim (1-\alpha)*I_{tail} \quad (8)$$

Given these currents, the following voltages are produced at nodes N2, N3, and N4:

$$Von=(I_A+I_C)*Z_L \sim (1+\alpha)*I_{tail}*Z_L \quad (9)$$

$$Vop=(I_B+I_D)*Z_L \sim (1-\alpha)*I_{tail}*Z_L \quad (10)$$

In the above equations, the parameter α may be a predetermined constant with a value less than 1. Consider the example where α=0.25. Then, Von=1.25*$I_{tail}$*$Z_L$ and Vop=0.75*$I_{tail}$*$Z_L$, where $Z_L$ corresponds to the impedance of the input line. Because the quantity $I_{tail}$*$Z_L$ is the same in both equations, Von>Vop. When Von>Vop, the LFPS_detect_out signal of the comparator 140 corresponds to a value which indicates the presence of LFPS on the input line. In some cases, the comparator 140 may have some hysteresis to reject noise while amplifying the (Von∼Vop) difference signal to a CMOS level output.

When the signal detector is enabled (EN) and there is no LFPS on the input line, then the following currents exist. In this case, α<1 and, for example, may be a value of 0.5.

$$I_7=I_6=I_5=I_4=I_{tail}/4 \quad (11)$$

$$I_3=I_2=\alpha*I_{tail}/4, \quad (12)$$

$$I_1=(1+\alpha)*I_{tail}/4+gm \ Vref \quad (13)$$

$$I_0=(1+\alpha)*I_{tail}/4 \sim gm*Vref \quad (14)$$

In this case, $V_{REF,H}$−$V_{REF,L}$=2*Vref and ($V_{REF,H}$+$V_{REF,L}$)/2=$V_{REF,CM}$. These values cause the comparator 140 to output an LFPS_detect_out signal with a value of 0, indicating that no LFPS has been detected on the input line, at least not yet.

The self-bias circuit 150 includes a transistor $Q_{10}$ and a transistor $Q_{11}$ to control output of the tail current $I_{tail}$ to the rectifier 110, common mode signal generator 120, and the reference signal generator 130 based on enable signal EN (and the complement of this signal, ENB). The transistor $Q_{10}$ may be, for example, a PMOS transistor and transistor $Q_{11}$, may be, for example, an NMOS transistor.

When the enable signal ENB is at a logical 0 level, PMOS transistors $Q_{10}$ and $Q_{12}$ (198) and NMOS transistor $Q_{11}$ turn on and current flows from supply voltage VDD through resistors R10, R11, and R12 of the self-bias circuit 150. As a result, the voltage at the node between R11 and R12 turns on the first-tier transistors $Q_4$, and the logical 1 value of enable signal EN turns on transistor $Q_{11}$ at this time, thereby generating the tail current $I_{tail}$. The logical 0 level of the ENB signal couples the reference resistors R5, R6, and R7 to VDD, to thereby generate reference voltages $V_{REF,H}$, $V_{REF,CM}$, and $V_{REF,L}$.

When the enable signal EN is at a logical 1 level (and thus ENB is at logical 0 level), transistors $Q_{10}$, $Q_{11}$, and $Q_{12}$ turn on. As a result, the reference signal generator 130 is enabled (on) and transistors QA and QB (which correspond to current mirrors) generate current $I_{tail}$ for the rectifier 110 and the reference signal generator 130. In this state, the signal detector is enabled to detect, for example, LFPS signaling.

Figure 2:
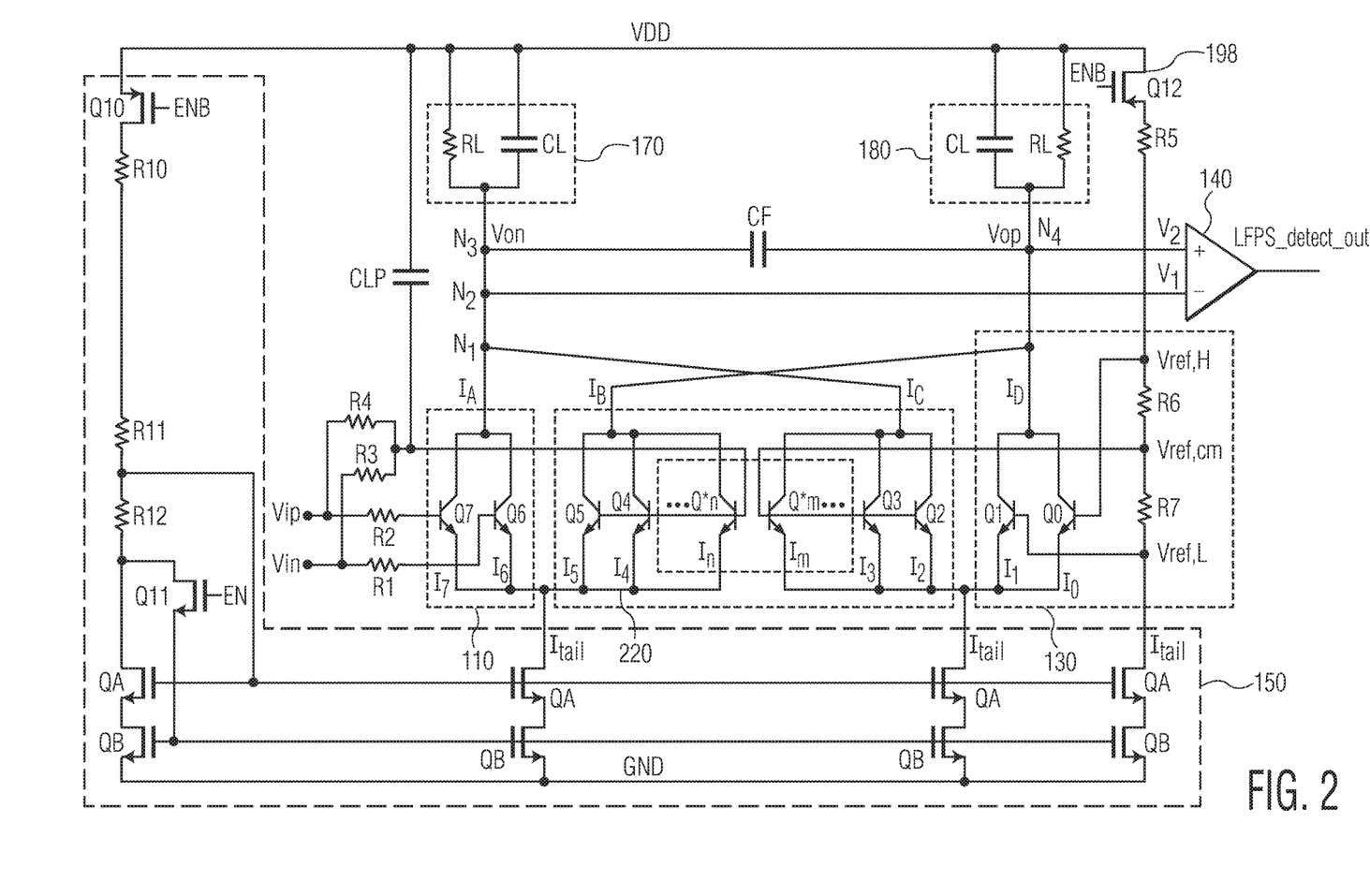
FIG. 2 illustrates another embodiment of a signal detector.

FIG. 2 illustrates another embodiment of a signal detector which may be the same as the signal detector of FIG. 1, except that the common mode generator 230 includes additional transistors. For example, one or more transistors n*Q transistors may be coupled in parallel to transistors $Q_4$ and $Q_5$ and m*Q transistors may be coupled in parallel to transistors $Q_2$ and $Q_3$. The bases of the additional n*Q transistors are coupled to the common mode voltage $V_{CM}$, and the bases of the additional m*Q transistors are coupled to the common mode reference voltage $V_{REF,CM}$. The values of n and m may be the same or different, where n≥1 and m≥1.

The additional transistors may reduce the tail current through the transistors by a proportional amount, but may increase the gain of the common mode signal generator 220 relative to the signal detector of FIG. 1. For example, adding two additional transistors to each side of the common mode signal generator may increase the gain by a factor of 2 without increasing the current, because all of the divided tail currents are summed at the same node. In one embodiment, extra parasitic capacitance generated by the additional transistors may supplement the filtering performed by capacitors CF and CL. As a result, the capacitances of CL and CF may be adjusted to lower values in order to compensate for the extra parasitic capacitors of the additional common mode transistors. Adding the additional transistors will not increase the size or chip space of the detector by any appreciable amount, but may improve gain significantly.

FIGS. 3A to 3D illustrate examples of input and output signals and waveforms generated by the signal detector of FIG. 1. The vertical dotted line separates a period when the signal detector is enabled but no LFPS signaling has been detected on the input line, e.g., when the LFPS_detect_out signal has a first value, e.g., 0. The period after the vertical dotted line corresponds to when the signal detector is enabled and an LFPS signaling has been detected on the input line, e.g., when the LFPS_detect_out has a second value, e.g., 1. Also, the signals illustrated as solid lines correspond to the signal detector of FIG. 1. The signals with dotted lines correspond to the signal detector of FIG. 2.

Figure 3A:
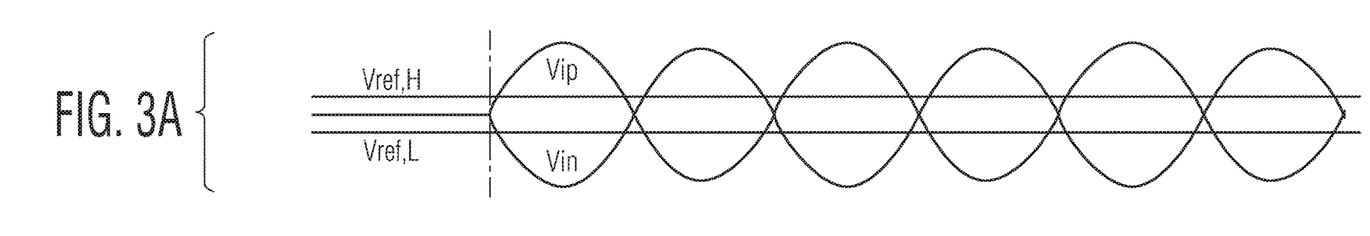
FIGS. 3A-3D illustrate examples of signals for the detectors of FIGS. 1 and 2.

During the period before an LFPS signal is received, in FIG. 3A, the components of the differential input signal (Vip, Vin) have a nominally zero value which lies between the high and low reference values, $V_{REF,H}$ and $V_{REF,L}$. In one embodiment, Vip and Vin may equal the common mode reference voltage $V_{REF,CM}$.

Figures 3B, 3C:
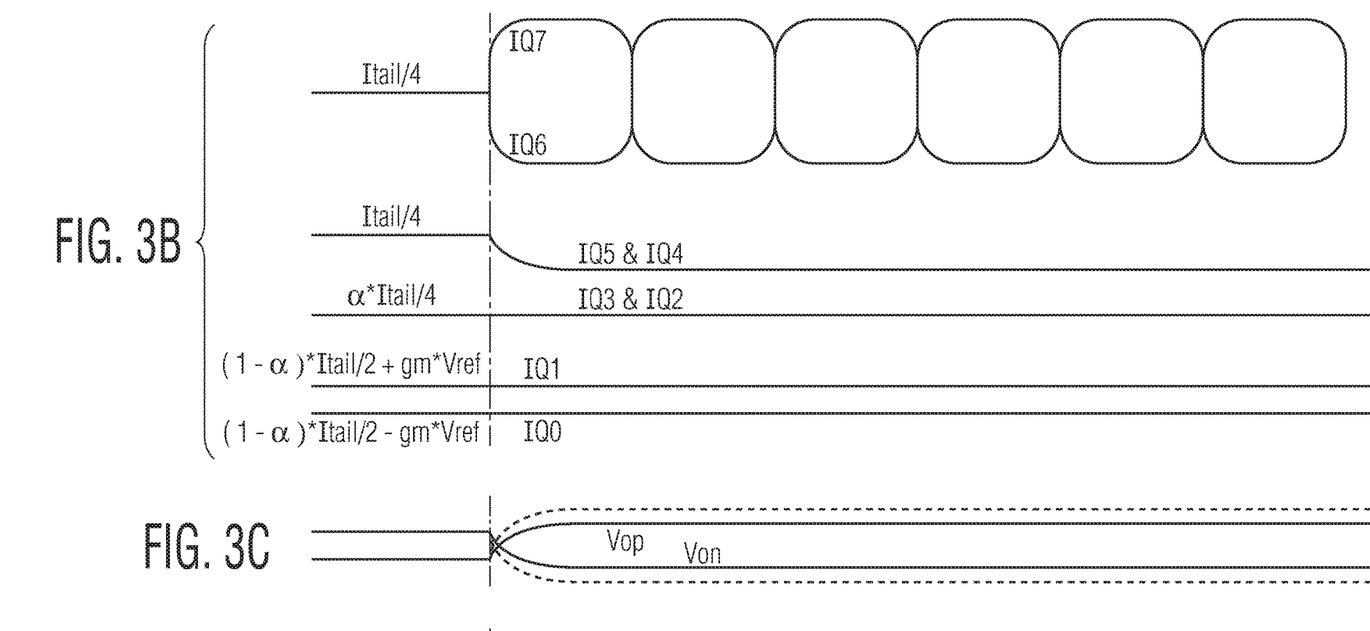

In FIG. 3B, the currents $I_6$ and $I_7$ through transistors $Q_6$ and $Q_7$ of the rectifier 110 are nominally zero, the currents $I_4$ and $I_5$ through transistors $Q_4$ and $Q_5$ equal $I_{tail}/4$, and the currents $I_2$ and $I_3$ through transistors $Q_2$ and $Q_3$ are at a constant value of $\alpha*I_{tail}/4$ because $I_{tail}$ is a constant value and the parameter $\alpha$ is fixed. Also, the currents $I_0$ and $I_1$ through transistors $Q_0$ and $Q_1$ are at constant values that respectively correspond to $(1+\alpha)*I_{tail}/4-gm*V_{ref}$ and $(1+\alpha)*I_{tail}/4+gm\,V_{REF}$, where gm is the transconductance of the transistor(s) of the comparator 140 and $V_F=(V_{REF,H}-V_{REF,L})$.

In FIG. 3C, the values Vop and Von are constant values. When there is no LFPS signaling, the input signal level<$V_{REF}=(V_{REF,H}-V_{REF,L})$ and Von=VDD-$R_L*(I_A+I_C)$ and Vop=VDD-$R_L*(I_B+I_D)$.

Figure 3D:
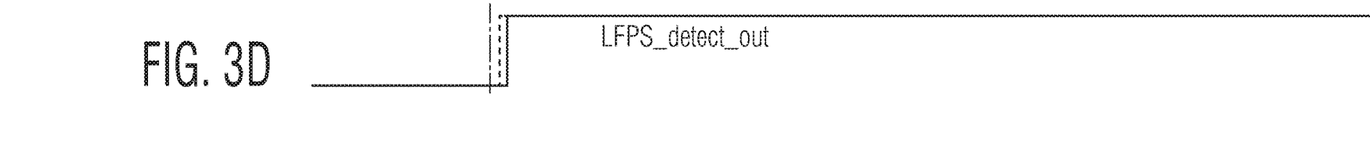

In FIG. 3D, the LFPS detector properly outputs an LFPS_detect_out signal with a first value (e.g., logical 0) indicating that LFPS signaling has not been detected on the input line.

During the period after an LFPS signal is received, in FIG. 3A, the components of the differential input signal (Vip, Vin) are out of phase by π and oscillate between positive and negative values that may be greater than the high and low reference values, $V_{REF,H}$ and $V_{REF,L}$. The frequency of Vip and Vin signal components may be determined, for example, by the channel frequency.

In FIG. 3B, the currents $I_6$ and $I_7$ through transistors $Q_6$ and $Q_7$ are rectified into what are effectively square waves of the same period as the differential components of the input signal and with a phase shift of π. As a result, currents $I_6$ and $I_7$ have a first value in the first half of the cycle and a second value in the second half of the cycle. Also, in FIG. 3B, each of the currents $I_4$ and $I_5$ through transistors $Q_4$ and $Q_5$ transition to a value lower than $I_{tail}/4$ based on the common mode voltage $V_{CM}$ output from the filter formed by resistors R3 and R4. The currents $I_0$, $I_1$, $I_2$, and $I_3$ remain constant at the same values as during the period before the LFPS signal was received.

In FIG. 3C, the values Vop and Von change and actually invert to a point where Vop>Von.

In FIG. 3D, the values of Vop and Von cause the comparator 140 of the signal detector to output a second value (e.g., logical 1) indicating the presence of LFPS signaling on the input line.

FIG. 3C also illustrates example results obtained for the signal detector of FIG. 2. In the signal detector of FIG. 2, the value of a is larger than the value of α in the signal detector of FIG. 1. Therefore, the gain of the comparator is higher than the gain of the signal detector of FIG. 1. This produces greater values for Vop and Von (see dashed curves) and earlier detection of LFPS signaling (e.g., by a number of nanoseconds), as indicated by the dashed line in (D). As a result, the current of the comparator in the embodiment of FIG. 2 may be reduced without sacrificing performance.

In accordance with one embodiment, a signal detector includes an input, a generator, and an output stage. These features are illustrated in the embodiments of FIGS. 1 and 2. For example, the input may receive a differential signal (Vip, Vin). The generator may generate a first voltage ($V_1$) based on the differential signal and a second voltage ($V_2$) based on the first voltage and a predetermined voltage (e.g., the voltage Vop at node N4 is generated based on the difference between $V_{REF,H}$ and $V_{REF,L}$ which control current through $Q_0$ and $Q_1$, respectively). The output stage may output a detection signal (LFPS_detect_out) based on the first voltage and the second voltage. The detection signal may have a first value when a difference between the first and second signals is in a first range (e.g., when $|Vip-Vin|<(V_{REF,H}-V_{REF,L})$) and may have a second value when the difference between the first and second signals is in a second range (e.g., when $|Vip-Vin|>(V_{REF,H}-V_{REF,L})$). The first value of the detection signal may indicate that the differential signal does not correspond to a predetermined type of signaling, and the second value of the detection signal may indicate that the differential signal corresponds to the predetermined type of signaling. The predetermined type of signaling may be low frequency periodic signaling or another type of signal or signaling.

Figure 4:
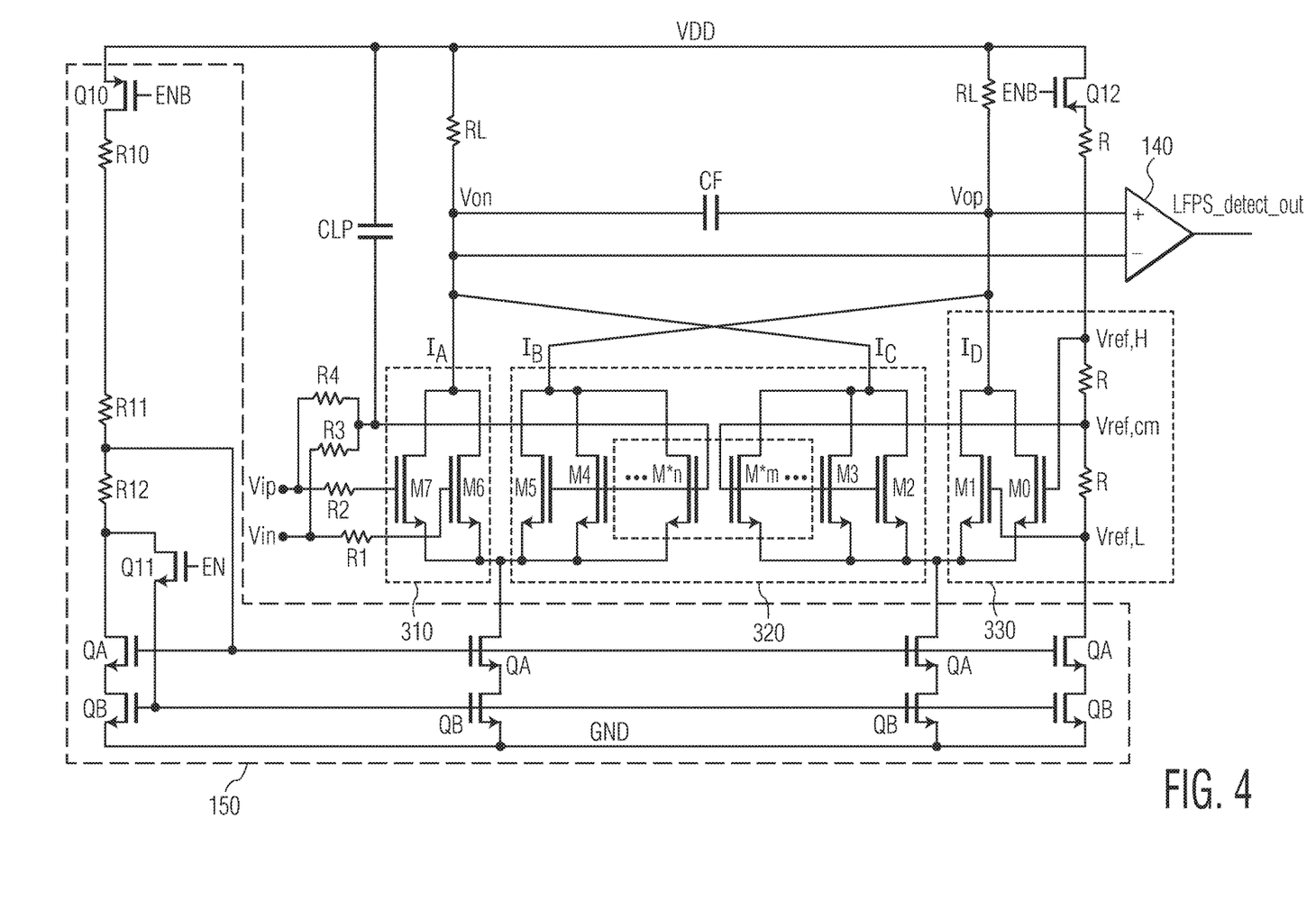
FIG. 4 illustrates another embodiment of a signal detector.

FIG. 4 illustrates another embodiment of a signal detector which may be used, for example, for detecting LFPS signaling. The signal detector of this embodiment may be the same as the signal detector of FIG. 2, except that MOS transistors are used to implement the rectifier 310, the common mode signal generator 320, and the reference signal generator 330. As illustrated in FIG. 4, the MOS transistors may be NMOS transistors having gates connected in a manner analogous to the bases of the bipolar transistors in FIG. 2.

In accordance with one or more of the aforementioned embodiments, a signal detector includes a rectifier that generates a first current based on an input signal, a first circuit that generates a second current based on a first reference signal, a second circuit that generates a third current based on a common mode voltage, a reference signal generator that generates a fourth current based on a second reference signal and a third reference signal, and a comparator that generates a detection signal based on the first current, the second current, the third current, and the fourth current. The detection signal may be generated to detect low frequency periodic signaling or another type of signal on a communication line. The communication line may be, for example, a channel of an interface.

In one embodiment, the signal detector may be used in a redriver for a USB, DP, TBT, or CIO mode application. Such a redriver may be limiting or linear, and the signal detector may be implemented without providing extra bias because of the self-bias circuit. In one embodiment, all or a portion of the reference signals may be generated from bias. The hysteresis in the comparator may reduce the sensitivity of the signal detector to supply noise, and in some cases may make the signal detector immune to such noise. In addition to interface applications, the signal detector may be used in other applications, where, for example, a fast response squelch detector is to be implemented.

In addition to the aforementioned features, the self-biased circuit of the embodiments disclosed herein may allow for improved performance, for example, by helping the chip of the signal detector to maintain a low-power savings mode. In one embodiment, each of the left and right reference branches of the common mode signal generator may take a current of 10 uA, while each of the other two branches (e.g., the rectifier circuit and the reference level generator) may take a current of 20 uA. Other performance benefits of the signal detector embodiments include, but are not limited to, fast-response time, fast power-up, low-current and low-power operation, improved detection accuracy, integrated hysteresis, the use of an integrated rectifier and integrated comparator, and built-in secondary ESD protection.

The controllers, filters, generators, stages, inputs, rectifiers, and other signal-generating and signal-processing features of the embodiments disclosed herein may be implemented in logic which, for example, may include hardware, software, or both. When implemented at least partially in hardware, the controllers, filters, generators, stages, inputs, rectifiers, and other signal-generating and signal-processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, filters, generators, stages, inputs, rectifiers, and other signal-generating and signal-processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A signal detector, comprising:
   a rectifier configured to generate a first current based on an input signal;
   a first circuit configured to generate a second current based on a first reference signal;
   a second circuit configured to generate a third current based on a common mode voltage of the input signal;
   a reference signal generator configured to generate a fourth current based on a second reference signal and a third reference signal; and
   a comparator configured to generate a detection signal based on the first current, the second current, the third current, and the fourth current.

2. The signal detector of claim 1, wherein the comparator is configured to compare a first voltage and a second voltage, the first voltage based on a sum of the first current and the second current and the second voltage based on a sum of the third current and a fourth current.

3. The signal detector of claim 2, wherein:
   the first voltage is based on a voltage of a first node that receives the first current and the second current,
   the second voltage is based on a voltage of a second node and a voltage of a third node,
   the second node voltage based on the first voltage, and
   the third node voltage based on the second voltage.

4. The signal detector of claim 3, further comprising:
   a filter coupled between the second node and the third node.

5. The signal detector of claim 1, further comprising:
   a self-bias circuit configured to input a tail current into one or more of the rectifier, the first circuit, the second circuit, and the reference signal generator.

6. The signal detector of claim 1, further comprising:
   an electrostatic discharge protection circuit coupled between the input line and the rectifier.

7. The signal detector of claim 1, further comprising:
   a circuit configured to generate the common mode voltage based on first and second signals,
   wherein the input signal is a differential signal that includes the first and second signals, and
   wherein the circuit configured to generate the common mode voltage performs electrostatic discharge protection.

8. The signal detector of claim 1, wherein:
   the input signal includes a first differential signal and a second differential signal, and
   the rectifier is configured to generate the first current based on the first differential signal and the second differential signal.

9. The signal detector of claim 1, wherein:
   the first reference signal corresponds to a common mode reference voltage;
   the second reference signal corresponds to a first reference voltage;
   the third reference signal corresponds to a second reference voltage; and
   the common mode reference voltage is between the first reference voltage and the second reference voltage.

10. The signal detector of claim 1, wherein the detection signal indicates presence of low frequency periodic signaling on a channel of an interface.

11. A signal detector, comprising:
an input configured to receive a differential signal;
a generator configured to generate a first voltage based on the differential signal and a second voltage based on the first voltage and a predetermined voltage; and
an output stage configured to output a detection signal based on the first voltage and the second voltage, wherein the differential signal includes a first signal and a second signal and wherein the detection signal has a first value when a difference between the first and second signals is in a first range and a second value when the difference between the first and second signals is in a second range.

12. The signal detector of claim 11, wherein:
the first range is a voltage less than the predetermined voltage, and
the second range is a voltage greater than the predetermined voltage.

13. The signal detector of claim 11, wherein:
the first value of the detection signal indicates that the differential signal does not correspond to a predetermined type of signaling, and
the second value of the detection signal indicates that the differential signal corresponds to the predetermined type of signaling.

14. The signal detector of claim 13, wherein the predetermined type of signaling is low frequency periodic signaling.

15. The signal detector of claim 11, wherein the generator is configured to:
generate the first voltage based on a first current and a second current,
the first current to be generated based on the first and second signals of the differential signal, and
the second current to be generated based on a common mode reference voltage.

16. The signal detector of claim 15, wherein:
the predetermined voltage corresponds to a difference between a first reference voltage and a second reference voltage; and
the common mode reference voltage is between the first and second reference voltages.

17. The signal detector of claim 15, wherein the generator is configured to:
generate the second voltage based on a third current and a fourth current;
the third current to be generated based on a first and second reference voltages; and
the fourth current to be generated based on a common mode voltage of the differential signal.

18. The signal detector of claim 17, wherein the predetermined voltage is based on a difference between the first and second reference voltages.

19. The signal detector of claim 11, further comprising:
a self-bias circuit coupled to the generator.

20. The signal detector of claim 11, further comprising:
an electrostatic discharge circuit coupled to the input.

* * * * *